(12) United States Patent
Otsuka

(10) Patent No.: US 6,239,986 B1
(45) Date of Patent: May 29, 2001

(54) HOUSING BODY OF ELECTRONIC EQUIPMENT

(75) Inventor: Yumiko Otsuka, Tokyo (JP)

(73) Assignee: Koyo Electronics Industries Co., Ltd., Tokyo (JP)

( * ) Notice: Subject to any disclaimer, the term of this patent is extended or adjusted under 35 U.S.C. 154(b) by 0 days.

(21) Appl. No.: 09/273,988

(22) Filed: Mar. 22, 1999

(30) Foreign Application Priority Data

Nov. 30, 1998 (JP) .................................................. 10-338691

(51) Int. Cl.$^7$ ....................................................... H05K 7/14
(52) U.S. Cl. .......................... 361/796; 361/728; 361/752; 361/801; 362/249
(58) Field of Search .................................... 361/728, 736, 361/752, 759, 784, 801, 796, 807–810; 362/249; 340/630; 439/65; 220/4.02

(56) References Cited

U.S. PATENT DOCUMENTS 5,002,493 * 3/1991 Brown et al. ............................. 439/65
5,938,324 * 8/1999 Salmon et al. ........................ 361/555

* cited by examiner

Primary Examiner—Jayprakash N. Gandhi
(74) Attorney, Agent, or Firm—Ladas and Parry

(57) ABSTRACT

A housing body of electronic equipment has a square base body having a circumferential wall and a box-like case assembled with the base body. The base body has a built-in printed board assembly including first, second and third printed boards of which the first and second printed boards are arranged above one another, and the third printed board has engaging pawls formed at both its end portions engaged with one side of the first and second printed boards perpendicular thereto. The base body is provided with a plurality of printed board engaging members at an inner side of its circumferential wall, and with first support portions and struts in the vicinity of four corner portions of the base body. Each strut of one pair of struts opposed to each other is provided at its opposed face with a guide groove and with a printed board engaging hole which communicates with the guide groove. Each strut of the other pair of struts opposed to each other is provided with a second support portion at an upper end portion thereof. The first printed board is placed on the first support portion so as to be engaged with the printed board engaging members, both end portions of the third printed board being engaged in the guide grooves provided on the struts so that the engaging pawls of the third printed board are engaged with the printed board engaging holes, and end portions of the second printed board are placed on the second support portions.

8 Claims, 5 Drawing Sheets

HOUSING BODY OF ELECTRONIC EQUIPMENT

BACKGROUND OF THE INVENTION

The present invention relates to a housing body of electronic equipment which has a built-in printed board, and is mounted on a control panel or the like.

In electronic equipments such as a programmable controller or the like, a housing body is composed of a case which houses a printed board on which a CPU, an I/O circuit, an LED for display and the like are mounted, and a cover for closing an upper opening portion of the case. The cover is provided with a display portion for displaying an optical signal from the LED.

In the aforesaid electronic equipments, in general, the cover is fixed onto the housing body, to which a printed board is screwed, by means of a screw; for this reason, assembling is troublesome, and a number of many assembling processes has been required.

Moreover, the LED provided on the printed board must be arranged in the vicinity of the display portion located on the cover; for this reason, a design is troublesome. Taking the aforesaid problem into consideration, the LED and the display portion have been connected by means of an optical fiber. However, many optical fibers are wired in the housing body; for this reason, not only wiring of these optical fibers becomes complicated, but also the housing body itself must of large size.

The present invention has been made in order to solve the above problem. Therefore, an object of the present invention is to provide a housing body of electronic apparatus, which can be readily assembled, and can reduce a number of assembling processes, and further, can guide a light from a light source provided on a printed board to a display portion with a simple structure.

SUMMARY OF THE INVENTION

The present invention provides a housing body of electronic equipment, which comprises a square base body having a circumferential wall and a box-like case combined with the base body, and has a built-in printed board assembly including a plurality of printed boards, the printed board assembly comprising first, second and third printed boards, and being configured in a manner that the first and second printed boards are arranged up and down, and the third printed board having engaging pawls formed at its both end portions is combined with one side of the first and second printed boards in a state of being perpendicular to these first and second printed boards, the base body being provided with a plurality of printed board engaging members at an inner side of its circumferential wall thereof, and being provided with first support portions and struts at the vicinity of four corner portions, each strut of one pair of struts opposed to each other being provided at its opposed face with a guide groove and a printed board engaging hole which communicates with the guide groove, each strut of the other pair of struts opposed to each other being provided with a second support portion at an upper end portion thereof, the first printed board being placed on the first support portion so as to be engaged with the printed board engaging members, both end portions of the third printed board being interposed into the guide groove provided on the strut so that the engaging pawls of the third printed board are engaged with the printed board engaging holes, and end portions of the second printed board being placed on the second support portions.

The case is fitted into the base body so as to cover the printed board assembly, and a lower end portion of the case is provided with case engaging members, and further, the circumferential wall of the base body is provided with case engaging holes so that the case engaging members are engaged with the case engaging holes.

With the above construction, it is possible to assemble electronic equipments with a simple structure, and to greatly reduce the number of assembling processes.

Further, the present invention provides a housing body of an electronic equipment, which comprises a base body and a box-like case combined with the base body, and has a built-in printed board, including a prism which comprises a plurality of transparent photo-conductor and is attached to the case so that one end of the prism faces display portion provided on the case, and so that the other end thereof faces a light source provided on the printed board attached to the base body.

Further, in the housing body of the present invention, the prism is provided with an attachment engaging portion for attaching the prism to the case, a side wall of the case is provided with a pair of ribs which includes a prism receiving portion for receiving the attachment engaging portion and engaging with the same, an upper plate of the case is formed with a plurality of display holes constituting the display portion between the ribs, the prism is interposed between the ribs so that one end of the plurality of photo-conductors of the prism is fitted into each of the display holes, and the attachment engaging portion of the prism is engaged with the prism receiving portion of the rib.

Further, the housing body of the present invention includes a prism attachment plate for attaching the prism to the case, the upper plate of the case is formed with a plurality of display holes constituting the display portion, and is provided with attachment plate engaging members having engaging pawls formed in the identical direction at both sides of the display holes, the attachment plate is formed with engaging member receiving portions which are received the attachment plate engaging members and engaged with the same, and the plurality of photo-conductors are arranged perpendicular to the prism attachment plate so that one end of the plurality of photo-conductors is fitted into each of the display holes and so that the engaging member receiving portions of the attachment plate are engaged with the engaging members of the attachment plate.

With the above construction, it is possible to guide a light from a light source to the display portion with a simple structure, and to attach the prism to the case with a simple structure without interfering with other parts or the like.

DETAILED DESCRIPTION OF PREFERRED EMBODIMENTS

Figure 3:
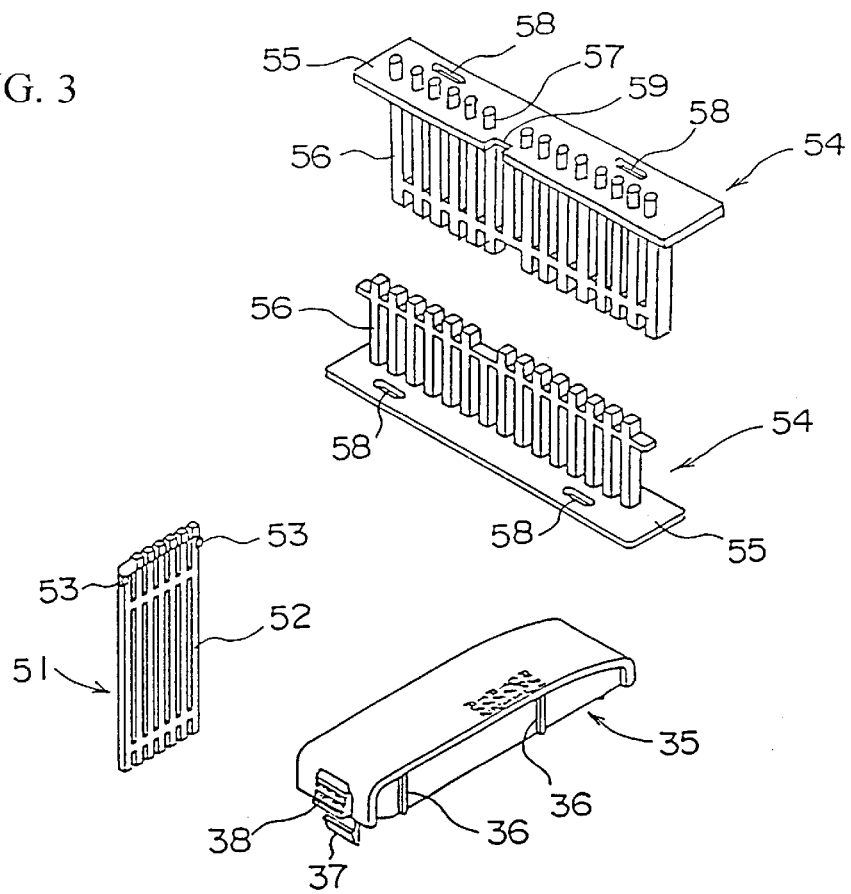
FIG. 3 is an exploded perspective view of a portion of the housing body shown in FIG. 1.
Figure 4:
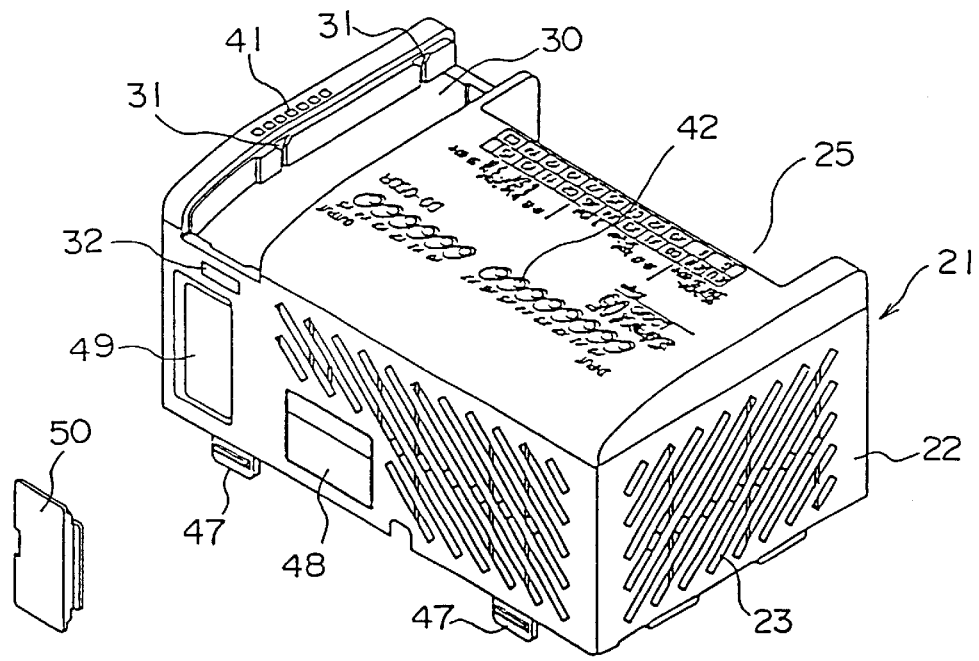
FIG. 4 is a perspective view showing a rear side of the case shown in FIG. 1.

A housing body of the present invention is composed of a base body 1, a case 21 and attachments such as prisms 51 and 54 (FIG. 3) or the like, and these parts will be described below in detail. A reference numeral 61 (FIG. 9) denotes a printed board assembly which is housed in the housing body. The printed board assembly 61 comprises: a CPU board 62 which is a first printed board on which many electronic parts (not shown) are mounted; an I/O board 63 which is a second printed board located above the CPU board 62; and a terminal board 64 which is a third printed board attached to an end portion of the I/O board 63 in a state of being perpendicular to the I/O board 63. The terminal board 64 is provided with engaging pawls 65 at both end portions. A reference numeral 66 denotes a plurality of light sources such as LED located on the CPU board 62, and 67 denotes a plurality of light sources such as LED located on the I/O board 63.

In the base body 1 constituting the housing body, a reference numeral 2 denotes a base having a low circumferential wall 3. The base 2 is provided with a support portion 4 on which the CPU board 62 of the printed board assembly 61 is placed, at its corner portions and at its intermediate portions in a longitudinal direction. Reference numerals 5a, 5b, 5c and 5d denote struts which stand at the corners of the base 2 or in the vicinity thereof. A pair of struts 5a and 5b, at its opposed face, are respectively formed with guide grooves 6 which vertically extend up to a substantially intermediate portion of the strut, and into which both end portions of the terminal board 64 are interposed. The lower end portion of the guide groove 6 is formed with an engaging hole 7 which opens in the opposite side thereof. Moreover, the upper portion of the other pair of struts 5c and 5d are respectively formed with support portions 8 on which corner portions of the I/O board 63 are placed.

A reference numeral 9 denotes engaging members which have engaging pawls, and are located at both sides in a longitudinal direction of the base 2 so as to be engaged with both end portions of the CPU board 62. A reference numeral 10 denotes engaging holes which are formed in the circumferential wall 3 and are engaged with engaging members of the case 21 which will be described later. A reference numeral 11 denotes an attachment arm to a control panel or the like, and 12 denotes an attachment member used in the case of attaching the housing body to a rail or the like.

Figure 5:
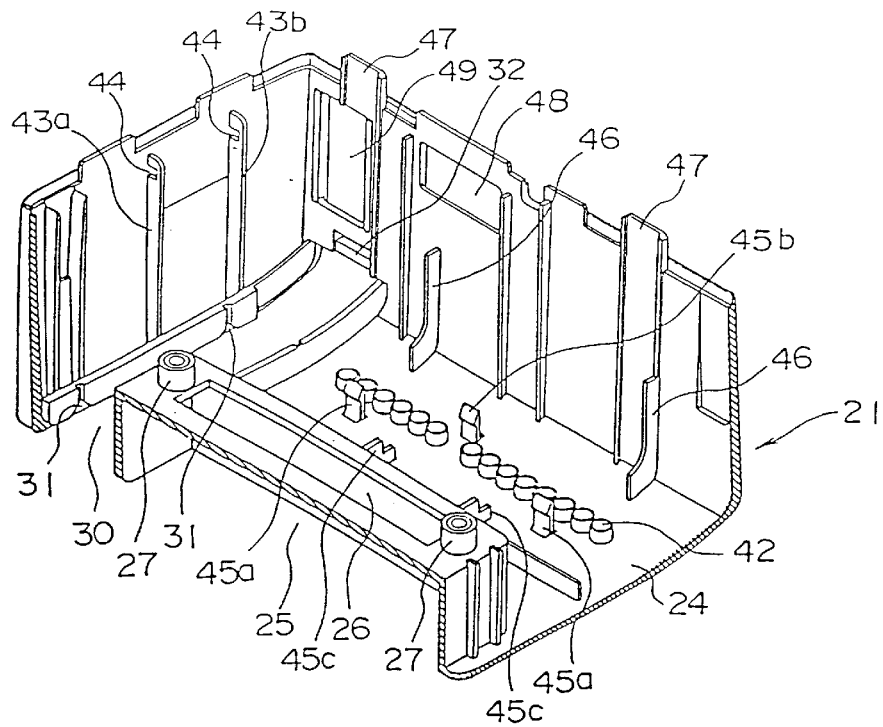
FIG. 5 is a perspective view showing a state that a front side of the case shown in FIG. 1 and a part of sides thereof are cut away.
Figure 6:
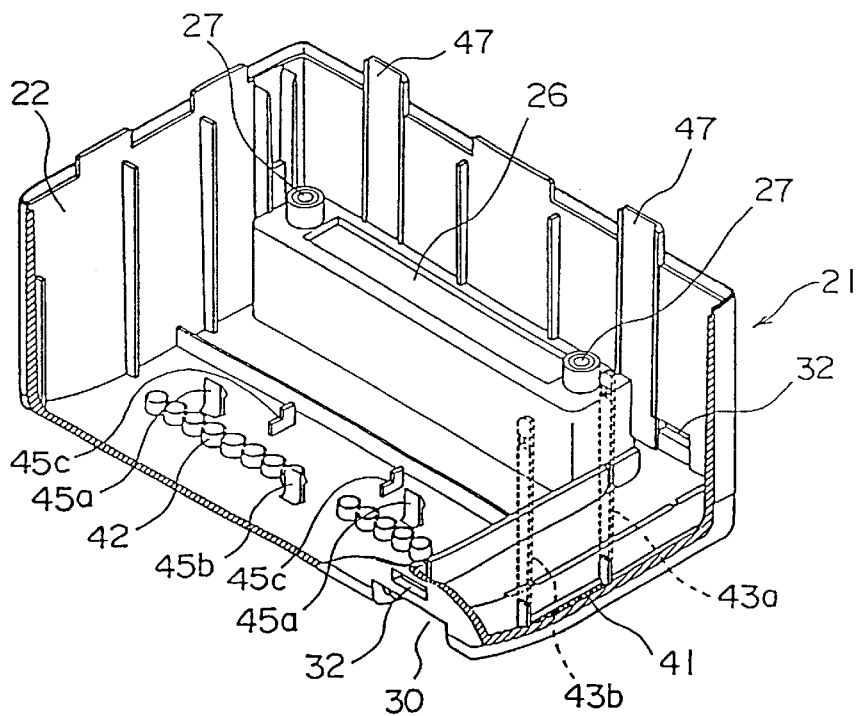
FIG. 6 is a perspective view showing a state that a rear side of the case shown in FIG. 1 and a part of sides thereof are cut away.

Next, the following is a description of the case 21 constituting the housing body. FIG. 5 is a perspective view showing a state that the case 21 is inverted and a front side of the case 21 is cut away. FIG. 6 is a perspective view showing a state that the case 21 is inverted in and a rear side of the case 21 is cut away. Also, in FIG. 5 and FIG. 6, no vent hole which will be described later is shown.

As shown in FIG. 2 to FIG. 6, the case 21 is formed into a box-like shape having an opening at a lower side thereof. A circumferential wall 22 is formed with a plurality of vent holes 23 which are tilted.

A reference numeral 25 denotes a terminal base attachment portion which is formed over an upper plate 24 from the front side of the circumferential wall 22. The attachment portion is formed with a hole 26 connecting with the terminal board 64, and with screw holes 27 for fixing the terminal base at both sides of the hole 26. Also, a reference numeral 28 denotes a notched portion for fitting a coin or the like therein so that detachment is made easy in the case of detaching the terminal base therefrom.

A reference numeral 30 denotes an expansion opening portion which is formed on one side of the upper plate 24 in a longitudinal direction, and 35 denotes a cap for closing the opening portion. The opening portion 30 is formed with guide grooves 31 for ribs 36 provided on both side walls of the cap 35 at its both side walls. In order to readily insert the rib 36, the guide groove 31 is of Y-shape having an upper enlarged funnel shape portion. A reference numeral 32 denotes an engaging hole which is formed in the circumferential wall 22 at the front and rear portions of the opening portion 30. The engaging holes 32 are engaged with engaging members 37 (no rear side engaging member 37 is shown in figures) which are provided at the front and rear portions of the cap 35. A reference numeral 38 denotes a pressed portion which is formed integrally with the engaging member 37, and releases an engagement of the engaging member 37 to the engaging hole 32 by pressing the pressed portion. Further, the pressed portion 38 has a lower portion which is inclined so that a user's finger can easily be set thereon.

A reference numeral 41 denotes display holes which are formed and opened on an upper surface of the upper plate 24 between the side wall of the opening portion 30 and the side wall 22 of the case 21, and constitute a plurality of display portions for displaying an optical signal from a light source 66 such as the LED provided on the CPU board 62. A reference numeral 42 denotes display holes which are formed on the upper plate 24, and constitute a plurality of display portions for displaying an optical signal from a light source 67 such as the LED provided on the I/O board 63. The display hole 42 has an inner face which is formed with a cylindrical shape. The upper plate 24 side corresponding to the display hole 42 is formed with a recessed portion which is formed as an inclined ellipse.

Reference numerals 43a and 43b denote a pair of ribs for attaching a CPU prism which will be described later. These ribs 43a and 43b are located on the inner wall of circumferential wall 22 on the opening portion 30 side along an elongation line at both sides of the display holes 41, and are respectively formed with engaging holes 44.

Reference numerals 45a and 45b denote a plurality of engaging members for attaching an I/O prism which will be described later. These engaging members 45a and 45b are located on both sides of the cylindrical display holes 42 in an inner surface of the upper plate 24, and have engaging pawls which extend in the same direction. A reference numeral 45c denotes a pair of support ribs which are provided on an inner surface of the upper plate 24 between the engaging members 45a. The aforesaid I/O prism is supported on stepped portions of the support ribs 45c.

A reference numeral 46 denotes a support rib for supporting the I/O board 63, which is located on an inner surface of the circumferential wall 22 on the rear side. A reference numeral 47 denotes an engaging member which projects from the lower end portion of the case 21, and is engaged with the engaging hole 10 of the base body 1. A reference numeral 48 denotes a modular jack insertion hole which is formed in the circumferential wall on the rear side, and 49 denotes an expansion modular jack insertion hole which is closed by a cover 50 when it is not used.

Figure 7:
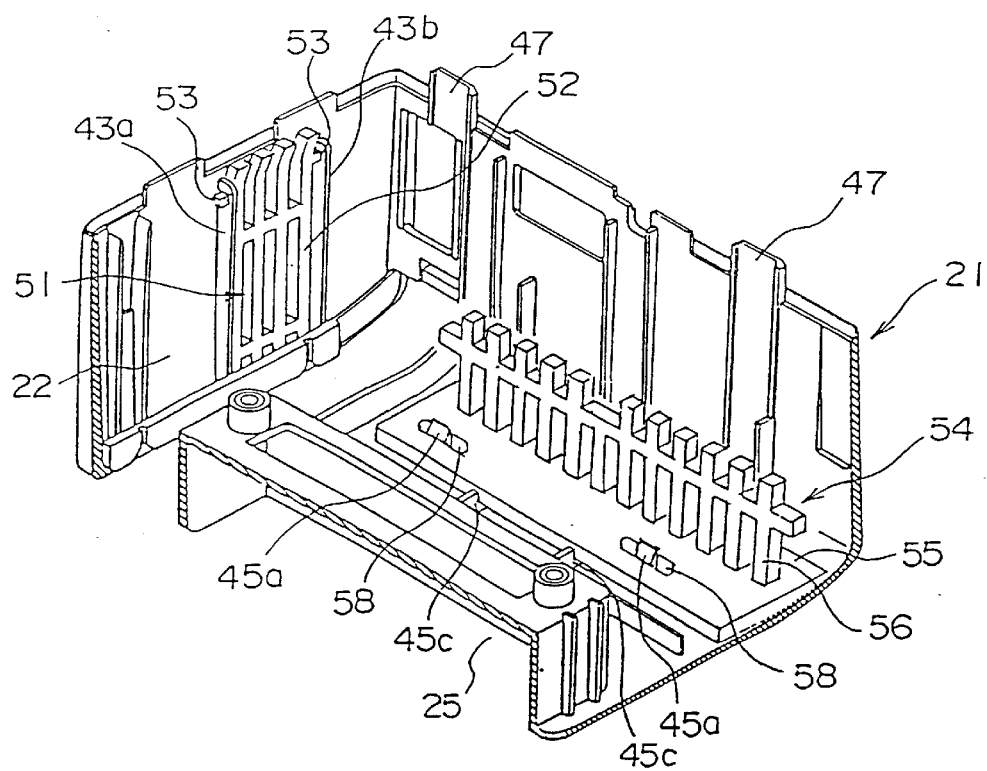
FIG. 7 is a perspective view showing a state that a prism is attached to the case.

A reference numeral 51 denotes a CPU prism which is a first prism. For example, the CPU prism 51 is made of a transparent synthetic resin, and comprises a plurality of photo-conductors 52 which correspond to the light source 66 located on the CPU board 62 and have a light emitting portion at the upper portion. As shown in FIG. 7, the CPU prism 51 is interposed between the attachment ribs 43a and 43b along the inner surface of the circumferential wall 22 of the case 21 so that a distal end portion of the CPU prism 51 is fitted into the display hole 41. Further, engaging portions 53 formed at both sides of the CPU prism 51 are fitted into engaging holes 44 formed in the attachment ribs 43a and 43b, and thus, the CPU prism 51 is mounted to the case 21.

A reference numeral 54 denotes an I/O prism which is a second prism. The I/O prism 54 includes an attachment plate 55, and one side of the attachment plate 55 is provided with a plurality of photo-conductors 56 which are perpendicular to the attachment plate 55, and correspond to the light source 67 located on the I/O board 63. Further, the other side of the attachment plate 55 is formed with light emitting portions 57 which are continuously arranged so as to correspond to these photo-conductors 56. A reference numeral 58 denotes a pair of engaging holes which are formed on one side of the attachment plate 55, and 59 denotes an engaging notched portion which is formed at an opposed side of the engaging holes 58 of the attachment plate 55.

The aforesaid I/O prism 54 is mounted to the case 21 in the following manner; more specifically, the light emitting portions 57 of the prism 54 are respectively interposed into display holes 42 from the inner side of the case 21, and then, as shown in FIG. 7, one-side engaging members 45a located on the upper plate 24 are respectively fitted into engaging holes 58 formed on the attachment plate 55, and next, the attachment plate 55 is pressed down. Then the attachment plate is moved down along the other side engaging members 45b, and then, engaging holes 58 formed on the attachment plate 55 are engaged with engaging pawls of these engaging members 45a and 45b, and thus, the attachment plate 55 is fixed. At this time, one side of the attachment plate 55 is supported by the stepped portion of the support rib 45c, and the other side thereof is abutted against the upper plate 24. In this case, these engaging members 45a and 45b have engaging pawls formed in the same direction, so that the I/O prism 54 can be readily detached from the case 21 and attached thereto.

Next, is a description of one example of assembling procedures for housing the printed board assembly 61 into the housing body constructed as described above. In this case, the CPU board 62, the I/O board 63 and the terminal board 64 are combined so as to form the printed board assembly 61, and the case 21 is attached with the CPU prism 51 and the I/O prism 54.

Figure 8:
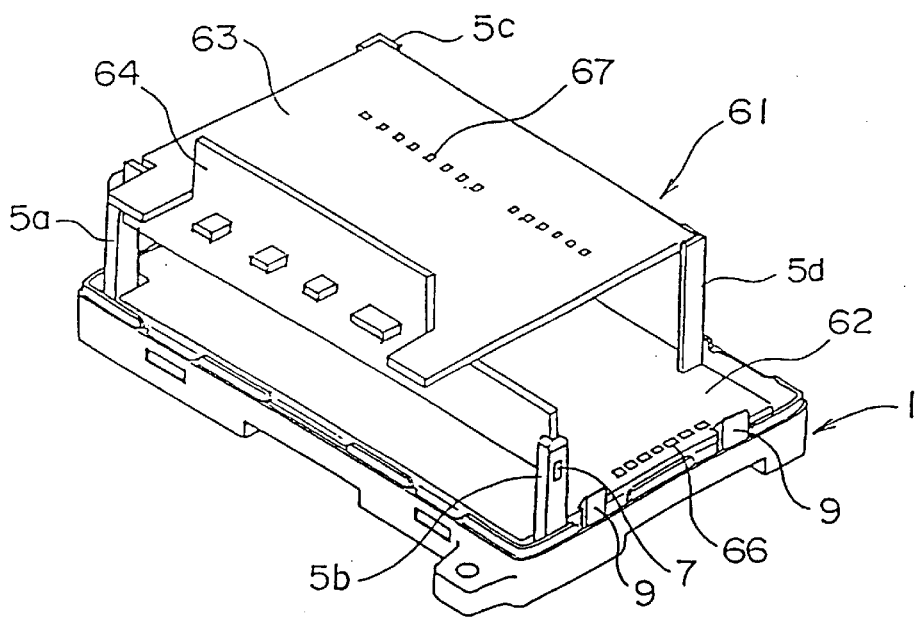
FIG. 8 is a perspective view showing a state that a printed board assembly is attached to the case.

First, the CPU board 62 of the printed board assembly 61 is placed on the base body 1, and then, is pressed down. By doing so, the CPU board 62 is placed on the first support portion 4 while both longitudinal edge portions are engaged with engaging pawls of the engaging members 9. Simultaneously, both end portions of the terminal board 64 are inserted into the guide grooves 6 of the struts 5a and 5b, and then, the engaging pawls 65 of the terminal board 64 are fitted into the engaging holes 7 of the struts 5a and 5b. Moreover, both end portions of the I/O board 63 are placed on the second support portions 8 of the struts 5c and 5d. FIG. 8 shows the assembled state at this time.

In the above manner, the printed board assembly 61 is positioned on the base body 1 without using a screw or the like, and then, is securely mounted thereto. The CPU board 62 is engaged with the engaging member 9, and the engaging pawls 65 provided on both end portions of the terminal board 64 are fitted into the engaging holes 7 of the struts 5a and 5b. Thus, even if the base body 1 falls sideways and is turned over, the printed board assembly 61 does not come off from the base body 1 or drops therefrom.

Figure 1:
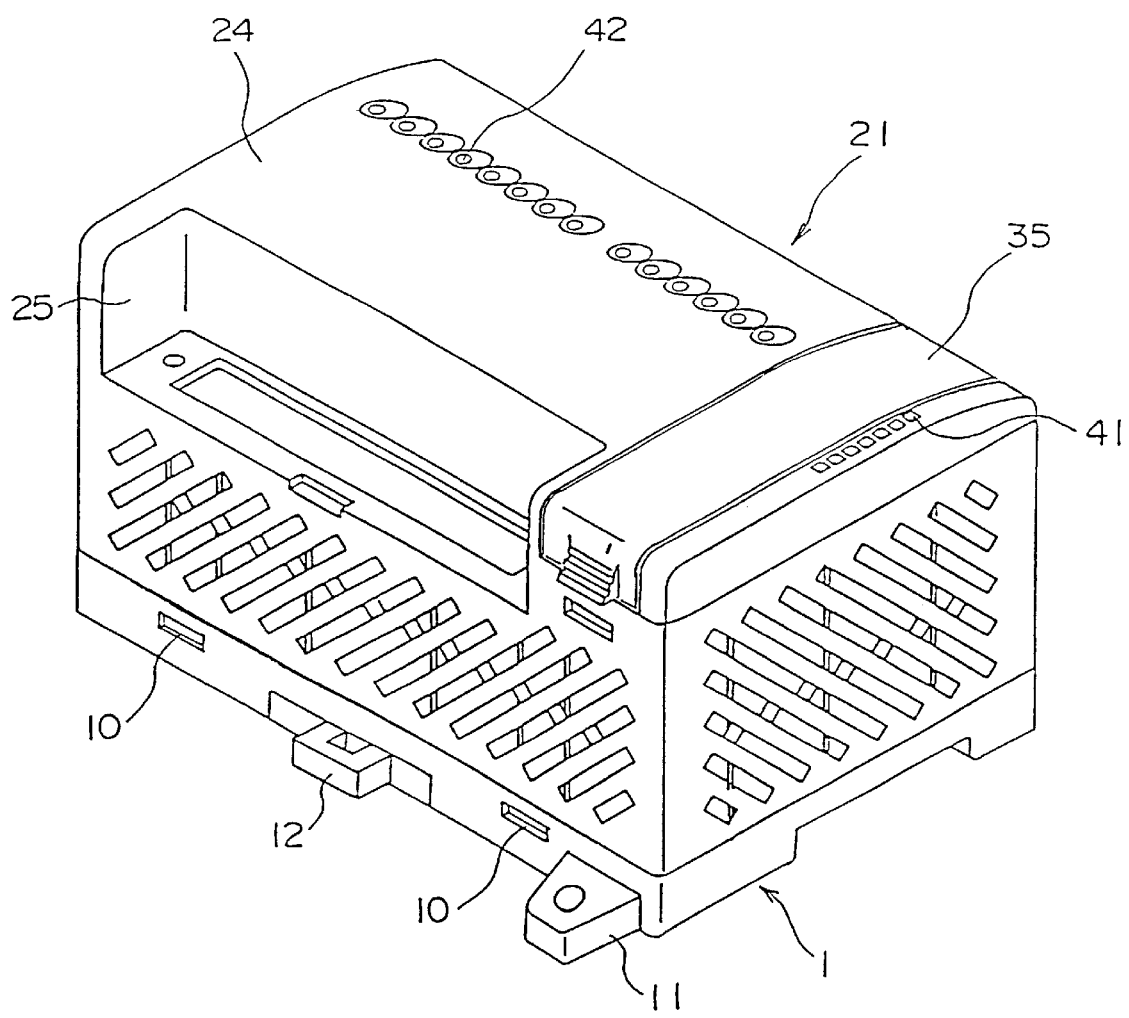
FIG. 1 is a perspective view showing the whole configuration of a housing body according to an embodiment of the present invention.
Figure 2:
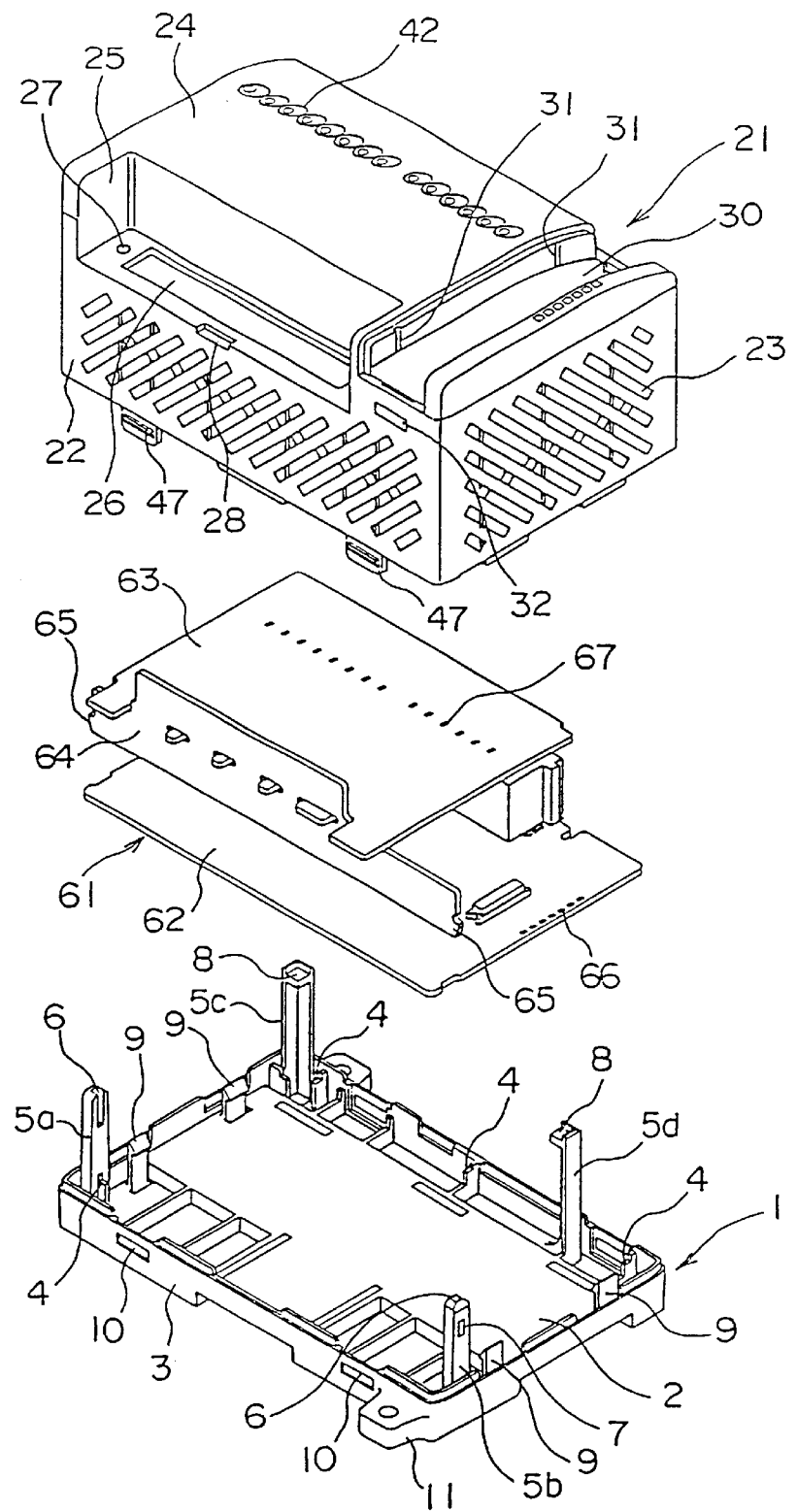
FIG. 2 is an exploded perspective view of a case shown in FIG. 1.

In this state, the terminal base attachment portion 25 of the case 21 is situated on the terminal board 64 side, and then, the case 21 is pressed down so as to be fitted into the printed board assembly 61. By doing so, the engaging members 47 provided on the lower end portion of the case 21 are engaged with the engaging holes 10 provided in the base body 1, and then, the case 21 and the base body 1 are integrally combined. The assembled state at this time is shown in FIG. 1. When the case 21 is mounted, the upper surface of the I/O board 63 is closely abutted against the support ribs 46 provided on the case 21; therefore, the I/O board 63 can be securely held in position.

At this time, each of the photo-conductors 52 of the CPU prism 51 and each of the photo-conductors 67 of the I/O prism 54 are abutted against or are close to the light source 66 of the CPU board 62 and the light source 67 of the I/O board 63, respectively. Therefore, when any of these light sources 66 and 67 emits light, the emitted light propagates through the corresponding photo-conductors 52 or 56 of the CPU prism 51 or the I/O prism 54, and thus, the display portions 41 or 42 emit light.

The embodiment of the present invention has been described. The present invention is not limited to the above embodiment, and various modifications are possible without departing from the scope of the present invention.

What is claimed is:

1. A housing body of electronic equipment, which comprises a square base body having a circumferential wall and a box-like case combined with the base body, and a built-in printed board assembly including a plurality of printing boards assembled with said base body, the printed board assembly comprising first, second and third printed boards, the first and second printed boards being arranged above one another, the third printed board having engaging pawls at end portions thereof and being engaged at one side of the second printed board perpendicular to the second printed board, the base body being provided with a plurality of printed board engaging members at an inner side of the circumferential wall thereof, and being provided with first support portions and struts in the vicinity of four corner portions of the base body, each strut of one pair of struts opposed to each other being provided with a guide groove at its opposed face and with a printed board engaging hole which communicates with the guide groove, each strut of the other pair of struts opposed to each other being provided with a second support portion at an upper end portion thereof, the first printed board being mounted on the first support portion so as to be engaged with the printed board engaging members, both end portions of the third printed board being interposed between the guide grooves provided on the struts so that the engaging pawls of the third printed board are engaged with the printed board engaging holes, and end portions of the second printed board being engaged on the second support portions.

2. A housing body of electronic equipment according to claim 1, wherein the case is fitted into the base body so as to cover the printed board assembly, a lower end portion of the case is provided with case engaging members, and the circumferential wall of the base body is provided with case engaging holes so that the case engaging members are engaged with the case engaging holes.

3. A housing body of electronic equipment according to claim 2, including a prism which comprises a plurality of transparent photo-conductors attached to the case so that one end of the prism faces a display portion provided on the case, and the other end thereof faces a light source provided on one of the printed boards attached to the base body.

4. A housing body of electronic equipment according to claim 3, wherein the prism is provided with attachment engaging portions for attaching the prism to the case, a side wall of the case is provided with a pair of ribs which includes prism receiving portions for receiving the attachment engaging portions of the prism, an upper plate of the case is formed with a plurality of display holes constituting the display portion between the ribs, the prism is interposed between the ribs so that one end of the plurality of photo-conductors of the prism is fitted into the display holes respectively, and the attachment engaging portions of the prism are engaged with the prism receiving portions of the ribs.

5. A housing body of electronic equipment according to claim 3, wherein the housing body further includes a prism attachment plate for attaching the prism to the case, an upper plate of the case is formed with a plurality of display holes constituting the display portion, and is provided at both sides of the display holes with attachment plate engaging members having engaging pawls formed in the same direction, the attachment plate is provided with engaging member receiving portions which receive the attachment plate engaging members and engage the same, and the plurality of photo-conductors are arranged perpendicular to the prism attachment plate so that one end of the plurality of photo-conductors is fitted into the display holes respectively and so that the engaging member receiving portions of the attachment plate are engaged with the engaging members of the attachment plate.

6. A housing body of electronic equipment according to claim 1, wherein the housing body further includes a prism which comprises a plurality of transparent photo-conductors and is attached to the case so that one end of the prism faces display portion provided on the case, and the other end thereof faces a light source provided on the printed board attached to the base body.

7. A housing body of electronic equipment according to claim 6, wherein the prism is provided with an attachment engaging portions for attaching the prism to the case, a side wall of the case is provided with a pair of ribs which include a prism receiving portions for receiving the attachment engaging portions and engaging the same, an upper plate of the case is formed with a plurality of display holes constituting the display portion between the ribs, and the prism is interposed between the ribs so that one end of the plurality of photo-conductors of the prism is fitted into the display holes respectively, and the attachment engaging portions of the prism is engaged with the prism receiving portions of the ribs.

8. A housing body of electronic equipment according to claim 6, wherein the housing body further includes a prism attachment plate for attaching the prism to the case, an upper plate of the case is formed with a plurality of display holes constituting the display portion, and is provided at both sides of the display holes with attachment plate engaging members having engaging pawls formed in the same direction, the attachment plate is provided with engaging member receiving portions which receive the attachment plate engaging members and engage the same, and the plurality of photo-conductors are arranged perpendicular to the prism attachment plate so that one end of the plurality of photo-conductors is fitted into each of the display holes respectively and so that the engaging member receiving portions of the attachment plate are engaged with the engaging members of the attachment plate.

* * * * *